(12) United States Patent
Nguyen et al.

(10) Patent No.: US 11,257,887 B2
(45) Date of Patent: Feb. 22, 2022

(54) THIN FILM TRANSISTOR SUBSTRATE, DISPLAY APPARATUS AND METHOD OF MANUFACTURING THE SAME

(71) Applicant: Samsung Display Co., Ltd., Yongin-Si (KR)

(72) Inventors: Thanh Tien Nguyen, Hwaseong-si (KR); Meejae Kang, Suwon-si (KR); Yongsu Lee, Seoul (KR); Sanggun Choi, Suwon-si (KR)

(73) Assignee: Samsung Display Co., Ltd.

( * ) Notice: Subject to any disclaimer, the term of this patent is extended or adjusted under 35 U.S.C. 154(b) by 57 days.

(21) Appl. No.: 16/737,653

(22) Filed: Jan. 8, 2020

(65) Prior Publication Data

US 2020/0312937 A1    Oct. 1, 2020

(30) Foreign Application Priority Data

Mar. 25, 2019    (KR) .......................... 10-2019-0033800

(51) Int. Cl.
| | |
|---|---|
| *H01L 27/14* | (2006.01) |
| *H01L 27/32* | (2006.01) |
| *H01L 27/12* | (2006.01) |
| *H01L 29/786* | (2006.01) |

(52) U.S. Cl.
CPC ...... *H01L 27/3262* (2013.01); *H01L 27/1262* (2013.01); *H01L 29/78603* (2013.01); *H01L 29/78642* (2013.01); *H01L 27/1274* (2013.01)

(58) Field of Classification Search
CPC ............. H01L 27/1262; H01L 27/3262; H01L 29/78603; H01L 29/78642
USPC .............................................. 257/43, 59, 72
See application file for complete search history.

(56) References Cited

U.S. PATENT DOCUMENTS

| | | | |
|---|---|---|---|
| 5,229,310 A | * | 7/1993 | Sivan ...................... H01L 27/12 |
| | | | 148/DIG. 150 |
| 8,481,360 B2 | | 7/2013 | Smith et al. |
| 9,859,346 B2 | | 1/2018 | Seo et al. |
| 10,032,807 B2 | * | 7/2018 | Peng ....................... H01L 27/12 |
| 10,741,777 B2 | * | 8/2020 | Hwang ............... H01L 27/3276 |
| 10,761,354 B2 | * | 9/2020 | Hanada ................. G02F 1/1368 |
| 2007/0082438 A1 | | 4/2007 | Li et al. |
| 2007/0254402 A1 | | 11/2007 | Dimmler et al. |

(Continued)

FOREIGN PATENT DOCUMENTS

JP        4926378 B2    5/2012

*Primary Examiner* — Tan N Tran
(74) *Attorney, Agent, or Firm* — Innovation Counsel LLP

(57) ABSTRACT

A thin film transistor substrate includes: a substrate, a first electrode disposed on the substrate, a bank disposed on the substrate and having an inclined surface inclined at an angle with respect to the substrate, a second electrode disposed on the bank, an active pattern electrically connected to the first electrode and the second electrode, disposed on the inclined surface, and including a first conductive region and a second conductive region in which impurities are doped, and a channel region between the first conductive region and the second conductive region, and a gate electrode overlapping at least a portion of the channel region of the active pattern. The inclined surface extends in a first direction in a plan view. The first conductive region, the channel region, and the second conductive region are sequentially disposed on the inclined surface along a second direction that crosses the first direction.

14 Claims, 13 Drawing Sheets

(56) References Cited

U.S. PATENT DOCUMENTS

| | | |
|---|---|---|
| 2017/0229483 A1* | 8/2017 | Chang ............... H01L 29/78642 |
| 2018/0175310 A1 | 6/2018 | Lee et al. |
| 2018/0248000 A1 | 8/2018 | Esteve et al. |
| 2018/0248035 A1 | 8/2018 | Park et al. |

* cited by examiner

THIN FILM TRANSISTOR SUBSTRATE, DISPLAY APPARATUS AND METHOD OF MANUFACTURING THE SAME

This application claims priority to Korean Patent Application No. 10-2019-0033800, filed on Mar. 25, 2019, and all the benefits accruing therefrom under 35 U.S.C. § 119, the disclosure of which is herein incorporated by reference in its entirety.

BACKGROUND

1. Field

Exemplary embodiments of the inventive concept relate to a thin film transistor substrate, a display apparatus having the thin film transistor substrate, and a method of manufacturing the thin film transistor substrate. More particularly, exemplary embodiments of the inventive concept relate to a thin film transistor substrate with improved space utilization, a display apparatus having the thin film transistor substrate with improved flexibility, and a method of manufacturing the thin film transistor substrate.

2. Description of the Related Art

Recently, a display apparatus having a light weight and a small size has been manufactured. A cathode ray tube (CRT) display apparatus has been used for many decades due to its performance and competitive price. However, the CRT display apparatus has disadvantages because of its size and portability. Therefore a flat panel display apparatus such as a plasma display apparatus, a liquid crystal display apparatus, and an organic light emitting display apparatus has been highly regarded due to its small size, light weight, and low-power-consumption.

To improve the display quality of the display apparatus, efforts to increase a resolution of the display apparatus have been made. However, as an area occupied by one pixel is reduced, a space for placing a thin film transistor is reduced.

In recent years, research has been actively conducted to develop a flexible display apparatus capable of folding a screen to enhance portability, and unfolding the screen when using the flexible display apparatus. There has been a demand for making a thickness of the flexible display apparatus thinner than that of a conventional display apparatus to impart and increase flexibility.

SUMMARY

One or more exemplary embodiments of the inventive concept provide a thin film transistor substrate having a thin film transistor with improved space utilization.

One or more exemplary embodiments of the inventive concept also provide a display apparatus having the thin film transistor substrate including a flexible area.

One or more exemplary embodiments of the inventive concept also provide a method of manufacturing the thin film transistor substrate.

According to an exemplary embodiment of the inventive concept, a thin film transistor substrate includes a substrate, a first electrode disposed on the substrate, a bank disposed on the substrate and having an inclined surface inclined at an angle with respect to the substrate, a second electrode disposed on the bank, an active pattern electrically connected to the first electrode and the second electrode, disposed on the inclined surface, and including a first conductive region and a second conductive region in which impurities are doped, and a channel region between the first conductive region and the second conductive region, and a gate electrode overlapping at least a portion of the channel region of the active pattern. The inclined surface extends in a first direction in a plan view. The first conductive region, the channel region, and the second conductive region are sequentially disposed on the inclined surface along a second direction that crosses the first direction.

In an exemplary embodiment, the channel region of the active pattern may be formed on the inclined surface.

In an exemplary embodiment, a height difference between the first electrode and the second electrode may be no more than 200 um (micrometer).

In an exemplary embodiment, the first conductive region may have a first portion overlapping the first electrode and a second portion connected to the first portion and overlapping a portion of the inclined surface that is adjacent to the first electrode.

In an exemplary embodiment, the active pattern may have an S-shape on the inclined surface.

According to an exemplary embodiment of the inventive concept, a display apparatus includes a substrate, a first bank disposed on the substrate and having a first inclined surface inclined at a first angle with respect to the substrate, a first thin film transistor including a first electrode, a second electrode, a first active pattern, and a gate electrode, and a light emitting structure electrically connected to the first thin film transistor. The first electrode is disposed on the substrate, and the second electrode is disposed on the first bank. The first active pattern is electrically connected to the first electrode and the second electrode and disposed on the first inclined surface. The first active pattern includes a first conductive region and a second conductive region in which impurities are doped, and a channel region between the first conductive region and the second conductive region, and the gate electrode overlaps the channel region of the first active pattern.

In an exemplary embodiment, the first inclined surface may extend in a first direction in a plan view. The first conductive region, the channel region, and the second conductive region may be sequentially disposed on the first inclined surface along a second direction that crosses the first direction. The substrate may include a first reinforcing area and a second reinforcing area and a flexible area that is bendable and disposed between the first reinforcing area and the second reinforcing area.

In an exemplary embodiment, a height difference between the first electrode and the second electrode may be no more than 200 um (micrometer).

In an exemplary embodiment, the first conductive region may have a first portion overlapping the first electrode and a second portion connected to the first portion and overlapping a portion of the first inclined surface that is adjacent to the first electrode.

In an exemplary embodiment, the display apparatus may further include a second bank spaced apart from the first bank in the first direction and a second thin film transistor including a second active pattern. The second bank may include a second inclined surface that is inclined at a second angle with respect to the substrate. The active pattern of the second thin film transistor may be disposed on the second inclined surface of the second bank.

In an exemplary embodiment, the display apparatus may further include a third bank spaced apart from the first bank in a second direction. Each of the first bank, the second bank, and the third bank has an island shape. The substrate may be bendable along the first direction and the second direction In an exemplary embodiment, the display apparatus may further include a second thin film transistor having a second active pattern. The first bank may further include a second inclined surface opposite to the first inclined surface. The second active pattern of the second thin film transistor may be disposed on the second inclined surface.

In an exemplary embodiment, a modulus of elasticity of the first bank may be 10 GPa or more.

In an exemplary embodiment, the channel region of the first active pattern may be formed on the inclined surface.

According to an exemplary embodiment of the inventive concept, a method of manufacturing a thin film transistor substrate includes forming a bank having an inclined surface inclined at a first angle with respect to a substrate, forming a preliminary active pattern including amorphous silicon on the inclined surface, irradiating the preliminary active pattern with an excimer laser to form an active pattern including polysilicon, forming a gate insulating layer on the active pattern, and forming a gate electrode on the gate insulating layer.

In an exemplary embodiment, a vertical height of the active pattern measured from the substrate may be no more than 200 um (micrometers).

In an exemplary embodiment, the method may further include forming a source region and a drain region by doping impurities in respective portions of the active pattern. The active pattern may include a channel region between the source region and the drain region and may overlap the gate electrode. The channel region of the active pattern may be formed on the inclined surface.

In an exemplary embodiment, the method may further include forming a first electrode on the substrate, and a second electrode on the bank. The first electrode may be connected to the source region of the active pattern, and the second electrode may be connected to the drain region of the active pattern. The first electrode and the second electrode may be spaced apart from each other in a plan view.

In an exemplary embodiment, modulus of elasticity of the bank may be 10 GPa or more.

According to the exemplary embodiments of the present inventive concept, a thin film transistor substrate includes a substrate, a first electrode disposed on the substrate, a bank disposed on the substrate and having an inclined surface inclined at an angle with respect to the substrate, a second electrode disposed on the bank, an active pattern electrically connected to the first electrode and the second electrode, disposed on the inclined surface, and including a first conductive region and a second conductive region in which impurities are doped, and a channel region between the first conductive region and the second conductive region, and a gate electrode overlapping the channel region of the active pattern. The inclined surface extends in a first direction in a plan view. The first conductive region, the channel region, and the second conductive region are sequentially disposed on the inclined surface along a second direction that crosses the first direction.

The active pattern of the thin film transistor is disposed on the inclined surface of the bank, so that a space in a plan view occupied by a plurality of thin film transistors included in one pixel can be reduced. Accordingly, the size of a pixel of the display device can be reduced, and the display device can have high resolution, and the display quality of the display device can be improved.

In addition, a height of the bank can be determined in consideration of a focal length of an excimer laser for crystallization of the active pattern. In addition, the channel region of the thin film transistor is formed on the inclined surface, thereby preventing deterioration of the quality of the thin film transistor that may be caused by a poor crystallization quality. In addition, the display apparatus can realize a flexible display apparatus including a flexible area in which the banks of appropriate shapes, sizes, and configurations are arranged so that the display device may be foldable, bendable, or rollable.

It is to be understood that both the foregoing general description and the following detailed description are exemplary and explanatory, and are intended to provide further explanation of the present disclosure including the inventive concept.

BRIEF DESCRIPTION OF THE DRAWINGS

The above and other features of the inventive concept will become more apparent by describing in detail exemplary embodiments thereof with reference to the accompanying drawings, in which.

DETAILED DESCRIPTION

Hereinafter, the inventive concept will be explained in detail with reference to the accompanying drawings.

Figure 1:
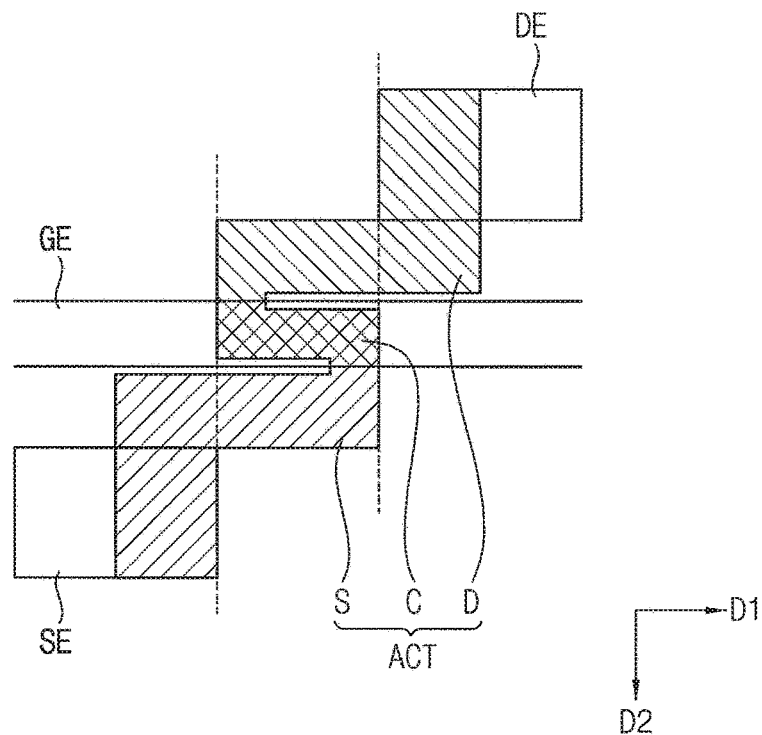
FIG. 1 is a plan view illustrating a thin film transistor substrate according to an exemplary embodiment of the inventive concept.
Figure 2:
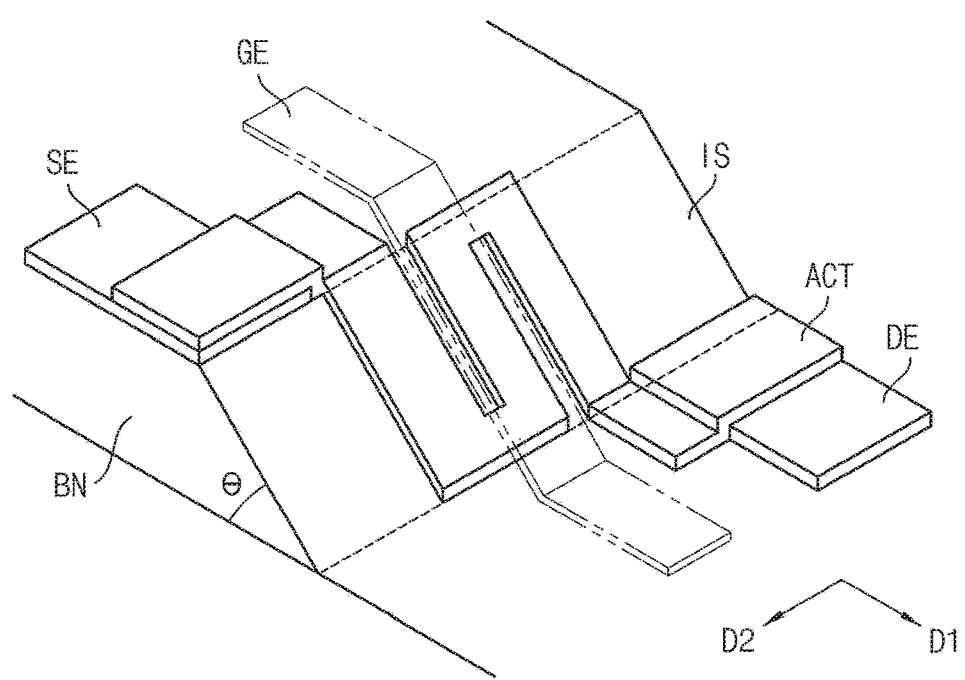
FIG. 2 is a perspective view illustrating the thin film transistor substrate of FIG. 1.
Figure 3:
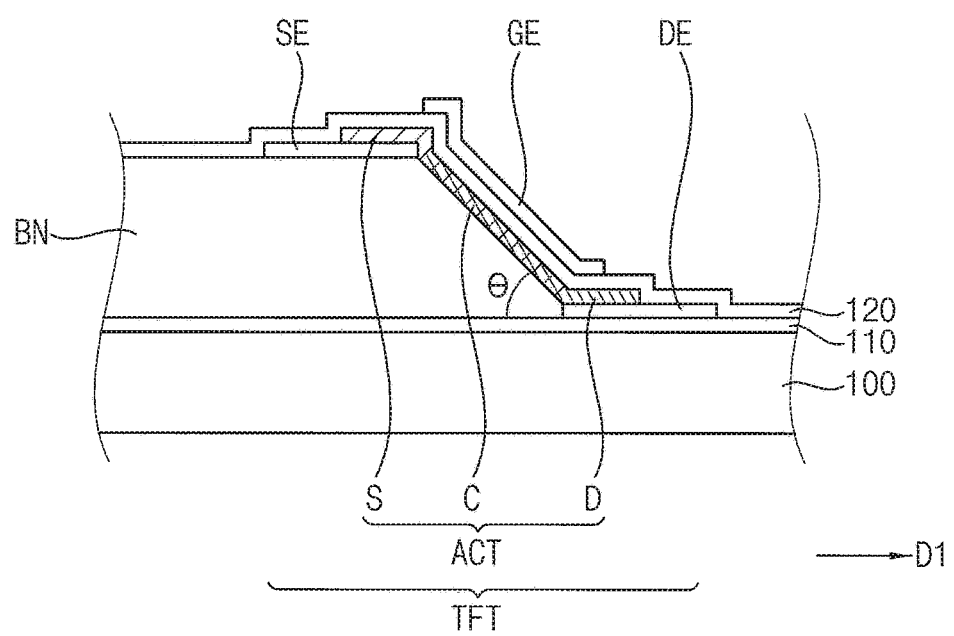
FIG. 3 is a conceptual cross-sectional view illustrating the thin film transistor substrate of FIG. 1.

FIG. 1 is a plan view illustrating a thin film transistor substrate according to an exemplary embodiment of the inventive concept. FIG. 2 is a perspective view illustrating the thin film transistor substrate of FIG. 1. FIG. 3 is a conceptual cross-sectional view illustrating the thin film transistor substrate of FIG. 1.

Referring to FIGS. 1 to 3, the thin film transistor substrate may include a substrate 100, a buffer layer 110, a first conductive layer including a drain electrode DE, a bank BN, a second conductive layer including a source electrode SE, an active pattern ACT, a gate insulating layer 120, a third conductive layer including a gate electrode GE.

The substrate 100 may be made of a transparent material or an opaque material. For example, the substrate 100 may include a quartz substrate, a synthetic quartz substrate, a calcium fluoride substrate, a fluorine-doped quartz substrate, a soda lime glass substrate, a non-alkali-alkali glass substrate, or the like. Alternatively, the substrate 100 may be made of a flexible resin substrate. An example of the flexible resin substrate that the substrate 100 can be made of may be a polyimide substrate. For example, the substrate 100 may include a polymer resin such as polyethersulphone (PES), polyacrylate (PAR), polyetherimide (PEI), polyethylene (PEN), polyethyleneterephthalate (PET), polyphenylene sulfide (PPS), polyallylate, polyimide (PI), polycarbonate (PC), and cellulose acetate propionate (CAP). The substrate 100 may have a thickness ranging from several micrometers (μm) to tens of micrometer.

The buffer layer 110 may be disposed on the substrate 100. The buffer layer 110 may prevent metal atoms or impurities from diffusing from the substrate 100 into a structure inside a display apparatus that includes the thin film transistor substrate.

The drain electrode DE may be disposed on the buffer layer 110. The drain electrode DE may be formed using a metal, an alloy, a metal nitride, a conductive metal oxide, a transparent conductive material, or the like.

The bank BN may be disposed adjacent to the drain electrode DE on the buffer layer 110. In the cross-sectional view of FIG. 3, the bank BN may have an inclined surface IS having an angle θ with respect to the substrate 100. The angle θ may be greater than 0 degree and less than 90 degree. For example, between the drain electrode DE and the source electrode SE, the inclined surface IS may extend in the first direction D1 in a plan view. A modulus of elasticity of the bank BN may be greater than a modulus of elasticity of the substrate 100. The modulus of elasticity represents a stiffness of a substance, or a material. The modulus of elasticity is typically defined as a slope of a stress-strain curve in an elastic deformation region. The larger the modulus of elasticity, the smaller the degree of change in shape, deformation, due to the external stress. That is, since the modulus of elasticity of the bank BN is larger than that of the substrate 100, the bank BN may be made of a material that is relatively stiffer (harder to deform) than the substrate 100. In some example embodiments, the modulus of elasticity of the bank BN may be 10 GPa or more.

The source electrode SE may be disposed on the bank BN. The source electrode SE and the drain electrode DE may be spaced apart from each other in a first direction D1 in a plan view, and spaced apart from each other in a second direction D2 that is perpendicular to the first direction D1. Accordingly, the inclined surface IS of the bank BN may be disposed between the source electrode SE and the drain electrode DE separating the source electrode SE and the drain electrode DE in both the first direction D1 and the second direction D2.

The active pattern ACT may be disposed on the inclined surface IS of the bank BN and extend to at least partially overlap the source electrode SE and the drain electrode DE, respectively. The active pattern ACT may include a semiconductor material such as silicon, germanium, and silicon-germanium. For example, the active pattern ACT may include polysilicon. The polysilicon may be formed by crystallizing amorphous silicon by irradiating an excimer laser to the amorphous silicon.

The active pattern ACT includes a drain region D and a source region S that are doped with an impurity, and a channel region C disposed between the drain region D and the source region S.

The drain region D, the channel region C, and the source region S of the active pattern ACT may be arranged in the second direction D2 on the inclined surface IS.

The drain region D of the active pattern ACT has a first portion disposed on the buffer layer 110 at least partially overlapping the drain electrode DE and a second portion extending in the first direction D1 on the inclined surface IS. The source region S of the active pattern ACT has a first portion disposed on the bank BN at least partially overlapping the source electrode SE and a second portion extending in the first direction D1 on the inclined surface IS.

The gate insulating layer 120 may be disposed on the active pattern ACT. The gate insulating layer 120 may include an inorganic insulating material and/or an organic insulating material. For example, the gate insulating layer 120 may include a silicon compound, a metal oxide, or the like.

The gate electrode GE may be disposed on the gate insulating layer 120 to overlap the channel region C of the active pattern ACT. The gate electrode GE may extend in the first direction D1.

A thin film transistor TFT may include the drain electrode DE, the source electrode SE, the active pattern ACT, and the gate electrode GE.

The channel region C may be disposed between the source region S and the drain region D. The active pattern ACT may extend along the second direction D2 in a zigzag pattern in the first direction D1. For example, the active pattern ACT may have an S-shape on the inclined surface IS. A channel length of the thin film transistor TFT can be adjusted by changing the shape and/or size of the active pattern ACT on the inclined surface IS, thereby adjusting the characteristics of the thin film transistor TFT.

The drain region D of the active pattern ACT has the first portion disposed on the buffer layer 110 at least partially overlapping the drain electrode DE and the second portion that is disposed on the inclined surface IS adjacent to the drain electrode DE and is connected with the first portion. Here, a transition region where the inclination of the active pattern ACT rapidly changes is formed between the first portion and the second portion at an end portion of the inclined surface IS. (see the dotted line extending in the second direction D2 in FIG. 1) Such a transition portion of the active pattern ACT may have a poor crystallization quality due to the rapid change of the inclination. However, since the transition portion that may exhibit poor crystallization quality has high conductivity by doping with impurities, deterioration of the characteristics of the thin film transistor TFT that may be caused by the poor crystallization quality can be minimized.

That is, the active pattern ACT may be disposed such that the channel region C is formed on the inclined surface IS, thereby preventing deterioration of the quality of the thin film transistor TFT that may be caused the crystallization quality problem. Here, the channel region C of the active pattern ACT may be formed substantially on the inclined surface IS, but a small deviation on the formation of the channel region C may occur due to manufacturing errors. For the convenience of description, the portion of the active pattern ACT that overlaps the inclined surface IS may be referred to as the channel region C.

Figure 4A:
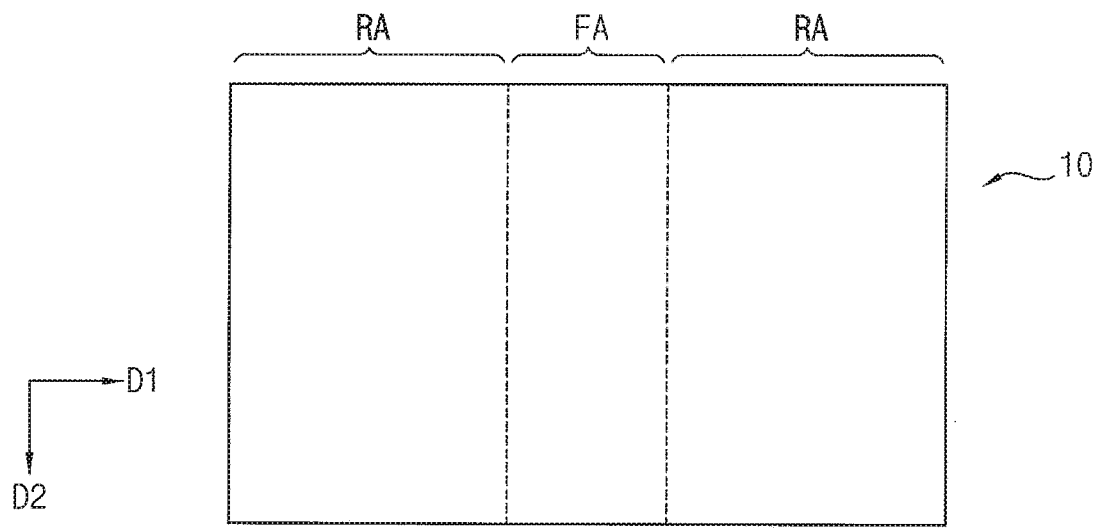
FIG. 4A is a plan view illustrating a display apparatus according to an exemplary embodiment of the inventive concept.
Figure 4B:
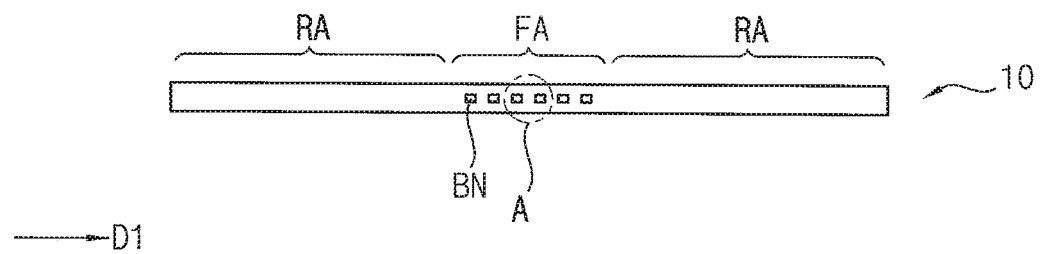
FIG. 4B is a cross-sectional view illustrating the display apparatus of FIG. 4A.
Figure 5A:
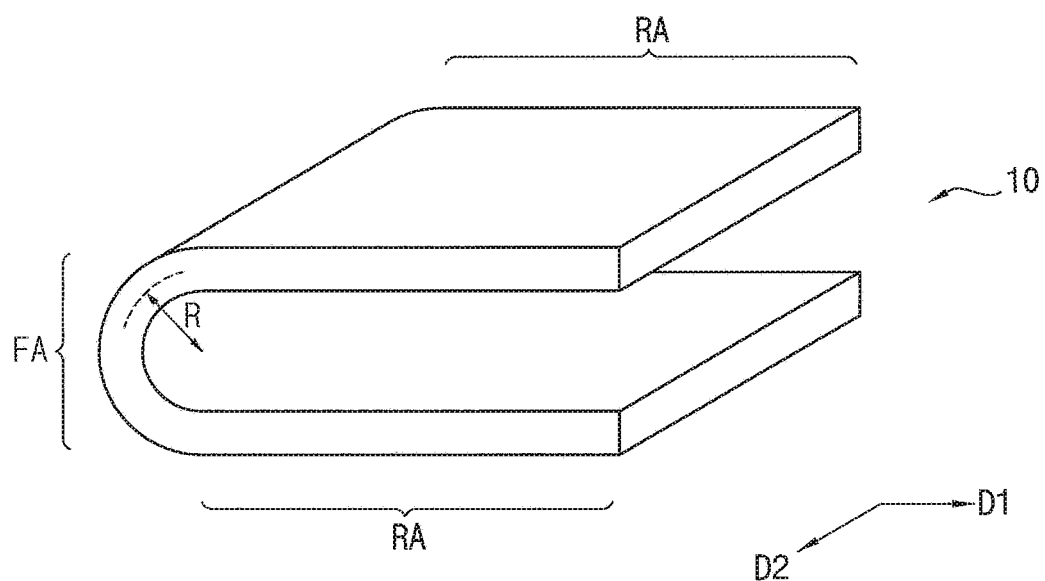
FIG. 5A is a perspective view illustrating that the display apparatus of FIG. 4A is folded.
Figure 5B:
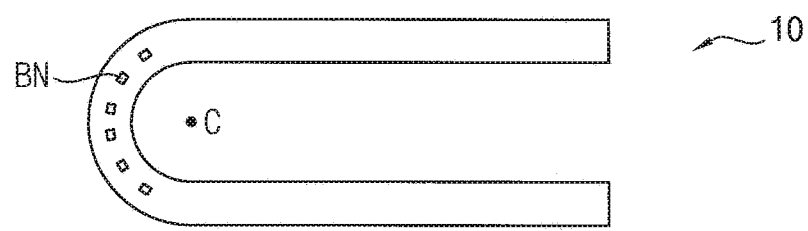
FIG. 5B is a cross-sectional view illustrating the display apparatus of FIG. 5A.

FIG. 4A is a plan view illustrating a display apparatus according to an exemplary embodiment of the inventive concept. FIG. 4B is a cross-sectional view illustrating the display apparatus of FIG. 4A. FIG. 5A is a perspective view illustrating that the display apparatus of FIG. 4A is folded. FIG. 5B is a cross-sectional view illustrating the display apparatus of FIG. 5A.

Referring to FIGS. 4A to 5B, a display apparatus 10 may include two reinforcing areas RA and a flexible area FA. The reinforcing areas RA are spaced apart from each other in a first direction D1 having the flexible area FA interposed therebetween. The flexible area FA may extend along a second direction D2 perpendicular to the first direction D1.

FIGS. 5A and 5B illustrate a foldable display apparatus in which the display apparatus 10 is folded about a folding axis C parallel to the second direction D2. The display apparatus 10 has a radius of curvature R in the flexible area FA.

The display apparatus 10 may include a plurality of banks BN formed in the flexible area FA. The plurality of banks BN may be spaced apart from each other in the first direction D1 and extend in the second direction D2.

A reinforcing layer (not shown) may be formed in the reinforcing area RA to have a fixed shape. In the flexible area FA, the plurality of banks BN are formed instead of the reinforcing layer to impart flexibility in the flexible area FA, for example foldable, bendable, or rollable. Here, the terms 'fixed', 'foldable', 'bendable', 'rollable', etc. are understood to describe a relative degree of flexibility between the flexible area FA and the reinforcing area RA. For example, the reinforcing area RA may also impart flexibility to some extent.

The modulus of elasticity of the reinforcing layer and the bank BN may be greater than the modulus of elasticity of the substrate 100 of the display apparatus 10.

The reinforcing layer may have a large modulus of elasticity, so that the display apparatus 10 may not bend easily in the reinforcing area RA. However, the display apparatus 10 can be foldable in the flexible area FA in which the bank BN is formed by using spaces between adjacent banks BN.

Figure 6:
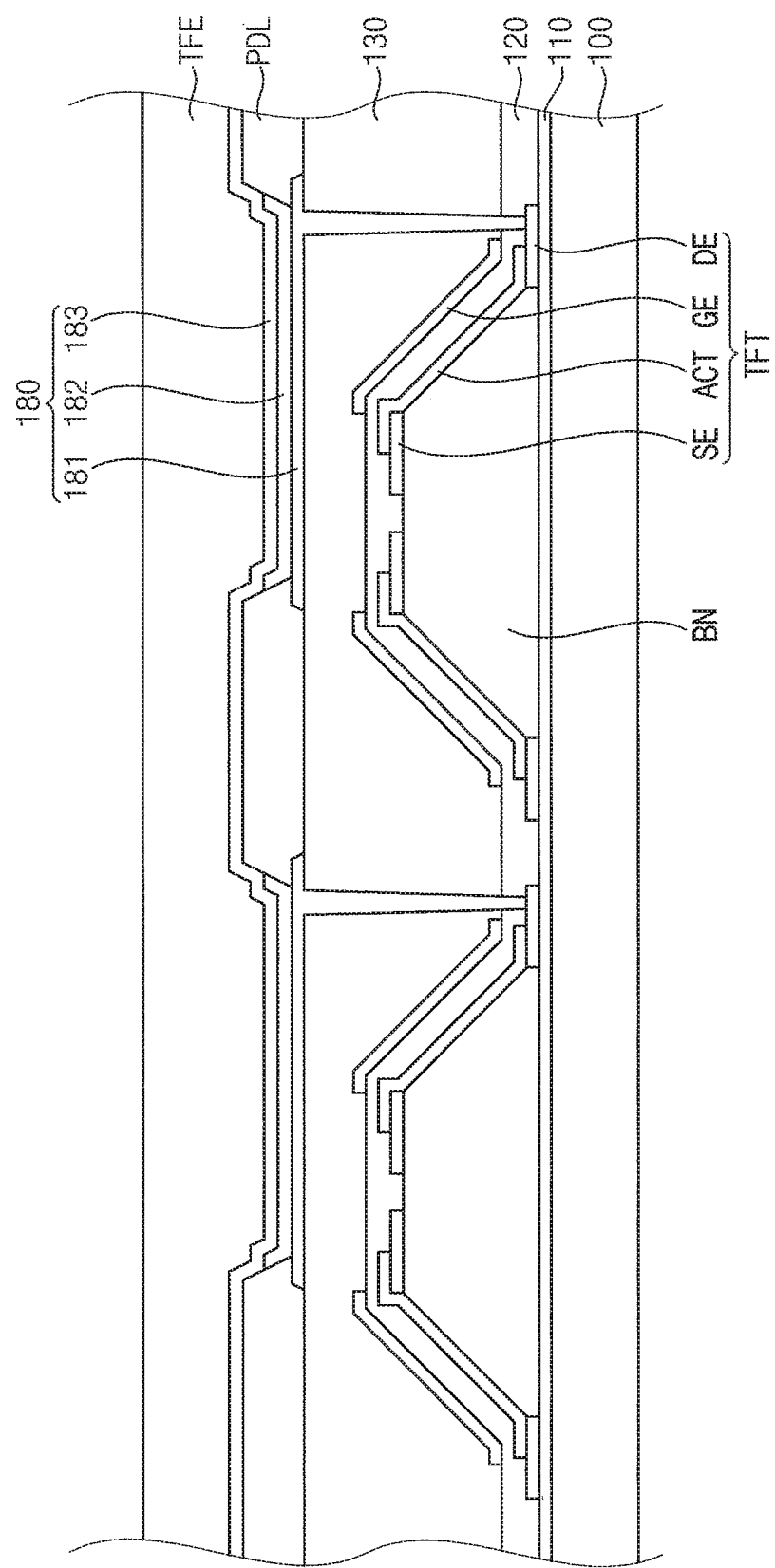
FIG. 6 is a cross-sectional view illustrating 'A' portion of FIG. 4B in detail.

FIG. 6 is a cross-sectional view illustrating 'A' portion of FIG. 4B in detail.

Referring to FIGS. 4B and 6, the display apparatus 10 may include the substrate 100, the buffer layer 110, the first conductive layer, the bank BN, the second conductive layer, the active pattern ACT, the gate insulating layer 120, the third conductive layer, a via insulating layer 130, a light emitting structure 180, a pixel defining layer PDL, and a thin film encapsulation layer TFE.

The substrate 100 may be made of a transparent material or an opaque material. Since the display apparatus 10 includes the flexible area FA having flexibility, the substrate 100 may be made of a flexible resin substrate. An example of the flexible resin substrate that the substrate 100 can be made of may be a polyimide substrate. For example, the substrate 100 may include a polymer resin such as polyethersulphone (PES), polyacrylate (PAR), polyetherimide (PEI), polyethylene (PEN), polyethyleneterephthalate (PET), polyphenylene sulfide (PPS), polyallylate, polyimide (PI), polycarbonate (PC), and cellulose acetate propionate (CAP). The substrate 100 may have a thickness ranging from several micrometers (μm) to tens of micrometer.

The buffer layer 110 may be disposed on the substrate 100. The buffer layer 110 may prevent metal atoms or impurities from diffusing from the substrate 100 into a structure inside the display apparatus 10.

The first conductive layer may be disposed on the buffer layer 110. The first conductive layer may be formed using a metal, an alloy, a metal nitride, a conductive metal oxide, a transparent conductive material, or the like. The first conductive layer may include the drain electrode DE.

The bank BN may be disposed adjacent to the drain electrode DE on the buffer layer 110. The bank BN may have an inclined surface IS having an angle with respect to the substrate 100. A modulus of elasticity of the bank BN may be greater than a modulus of elasticity of the substrate 100. In some example embodiments, the modulus of elasticity of the bank BN may be 10 GPa or more The second conductive layer may be disposed on the bank BN. The second conductive layer may include the source electrode SE.

The first conductive layer and the second conductive layer may be formed of different layers, but the present disclosure is not limited thereto. For example, the first and second conductive layers may be formed of the same layer after the bank BN is formed.

The active pattern ACT may be disposed on the inclined surface IS of the bank BN and extend to at least partially overlap the source electrode SE and the drain electrode DE respectively. The active pattern ACT may include a semiconductor material such as silicon, germanium, and silicon-germanium. For example, the active pattern ACT may include polysilicon. The polysilicon may be formed by crystallizing amorphous silicon by irradiating an excimer laser to the amorphous silicon.

The gate insulating layer 120 may be disposed on the active pattern ACT. The gate insulating layer 120 may include an inorganic insulating material and/or an organic insulating material. For example, the gate insulating layer 120 may include a silicon compound, a metal oxide, or the like.

The third conductive layer may be disposed on the gate insulating layer 120. The third conductive layer may include the gate electrode GE. The gate electrode GE may be disposed on the gate insulating layer 120 to overlap the channel region C of the active pattern ACT.

A thin film transistor TFT may include the drain electrode DE, the source electrode SE, the active pattern ACT, and the gate electrode GE.

Referring to a plurality of the banks BN are formed, and the thin film transistors TFT can be formed on the inclined surfaces IS of the respective banks BN. Further, one bank BN may have a plurality of inclined surfaces IS, and active patterns ACT of the thin film transistors TFT may be disposed on each of the inclined surfaces IS.

The via insulating layer 130 may be disposed on the gate insulating layer 120 covering the third conductive layer. The via insulating layer 130 may have a single layered structure or a multi-layered structure including at least two insulation films. The via insulating layer 130 may be formed using an organic material. For example, the via insulating layer 130 may include photoresist, acryl-based resin, polyimide-based resin, polyamide-based resin, siloxane-based resin, etc. In some example embodiments, the via insulating layer 130 may be formed using an inorganic material such as a silicon compound, metal, and metal oxide.

The light emitting structure 180 may include a first electrode 181, a light emitting layer 182, and a second electrode 183.

The first electrode 181 may be disposed on the via insulating layer 130. The first electrode 181 may include a reflective material or a transmissive material in accordance with the emission type of the display apparatus 10. For example, the first electrode 181 may be formed using aluminum, alloy containing aluminum, aluminum nitride, silver, alloy containing silver, tungsten, tungsten nitride, copper, alloy containing copper, nickel, alloy containing nickel, chrome, chrome nitride, molybdenum, alloy containing molybdenum, titanium, titanium nitride, platinum, tantalum, tantalum nitride, neodymium, scandium, strontium ruthenium oxide, zinc oxide, indium tin oxide, tin oxide, indium oxide, gallium oxide, indium zinc oxide, etc. These may be used alone or in any combination thereof. In example embodiments, the first electrode 181 may have a single layer structure or a multi-layer structure including a metal film, an alloy film, a metal nitride film, a conductive metal oxide film, and/or a transparent conductive film.

The pixel defining layer PDL may be disposed on the via insulating layer 130 on which the first electrode 181 is disposed. The pixel defining layer PDL may be formed using an organic material. For example, the pixel defining layer PDL may include photoresist, acryl-based resin, polyimide-based resin, polyamide-based resin, siloxane-based resin, etc. In some example embodiments, an opening that exposes a portion of the first electrode 181 may be formed by etching the pixel defining layer PDL. An emitting area and a non-emitting area of the display apparatus 10 may be defined by the opening of the pixel defining layer PDL. For example, a portion where the opening of the pixel defining layer PDL is located may correspond to the emitting area, and the non-emitting area may correspond to a portion adjacent to the opening of the pixel defining layer PDL.

The light emitting layer 182 may be disposed on the first electrode 181 that is exposed through the opening of the pixel defining layer PDL. In addition, the light emitting layer 182 may extend on a sidewall of the opening of the pixel defining layer PDL. In some example embodiments, the light emitting layer 182 may include an organic light emitting layer (EL), a hole injection layer (HIL), a hole transfer layer (HTL), an electron transfer layer (ETL), an electron injection layer (EIL), etc. In some example embodiments, except for the organic emitting layer, the hole injection layer, the hole transfer layer, the electron transfer layer, and the electron injection layer may be formed in common to correspond to a plurality of pixels. In some example embodiments, a plurality of organic light emitting layers may be formed using light emitting materials for generating different colors of light such as a red color of light, a green color of light, and a blue color of light in accordance with color pixels of the display apparatus 10. In some example embodiments, the organic light emitting layer of the light emitting layer 182 may include a plurality of stacked light emitting materials for generating a red color of light, a green color of light, and a blue color of light to emit a white color of light. Here, elements of the light emitting layer 182 may be commonly formed to correspond to a plurality of pixels, and each pixel may be divided by a color filter layer (not shown).

The second electrode 183 may be disposed on the pixel defining layer PDL and the light emitting layer 182. The second electrode 183 may include a transmissive material or a reflective material in accordance with the emission type of the display apparatus 10. For example, the second electrode 183 may be formed using aluminum, alloy containing aluminum, aluminum nitride, silver, alloy containing silver, tungsten, tungsten nitride, copper, alloy containing copper, nickel, alloy containing nickel, chrome, chrome nitride, molybdenum, alloy containing molybdenum, titanium, titanium nitride, platinum, tantalum, tantalum nitride, neodymium, scandium, strontium ruthenium oxide, zinc oxide, indium tin oxide, tin oxide, indium oxide, gallium oxide, indium zinc oxide, etc. These may be used alone or in any combination thereof. In example embodiments, the second electrode 183 may also have a single layer structure or a multi-layer structure that may include a metal film, an alloy film, a metal nitride film, a conductive metal oxide film, and/or a transparent conductive film.

The thin film encapsulation layer TFE may be disposed on the second electrode 183. The thin film encapsulation layer TFE may prevent penetration of moisture and oxygen from outside into the display apparatus 10. The thin film encapsulation layer TFE may include at least one organic layer and at least one inorganic layer. The at least one organic layer and the at least one inorganic layer may be alternately stacked with each other. For example, the thin film encapsulation layer TFE may include two inorganic layers and one organic layer disposed therebetween, but the present disclosure is not limited thereto. In some example embodiments, a sealing substrate for shielding outside air and moisture from penetrating into the display apparatus 10 may be provided instead of or in addition to the thin film encapsulation layer TFE.

According to the embodiments, the display apparatus 10 may include the flexible area FA where the bank BN is disposed. Thus, breakage due to bending of the display apparatus 10 can be prevented. In addition, since the active pattern ACT of the thin film transistor TFT is disposed on the inclined surface IS of the bank BN, the size of the thin film transistor TFT in a plan view can be reduced. As a result, the display apparatus 10 can have a pixel design margin and a high resolution.

Figure 7A:
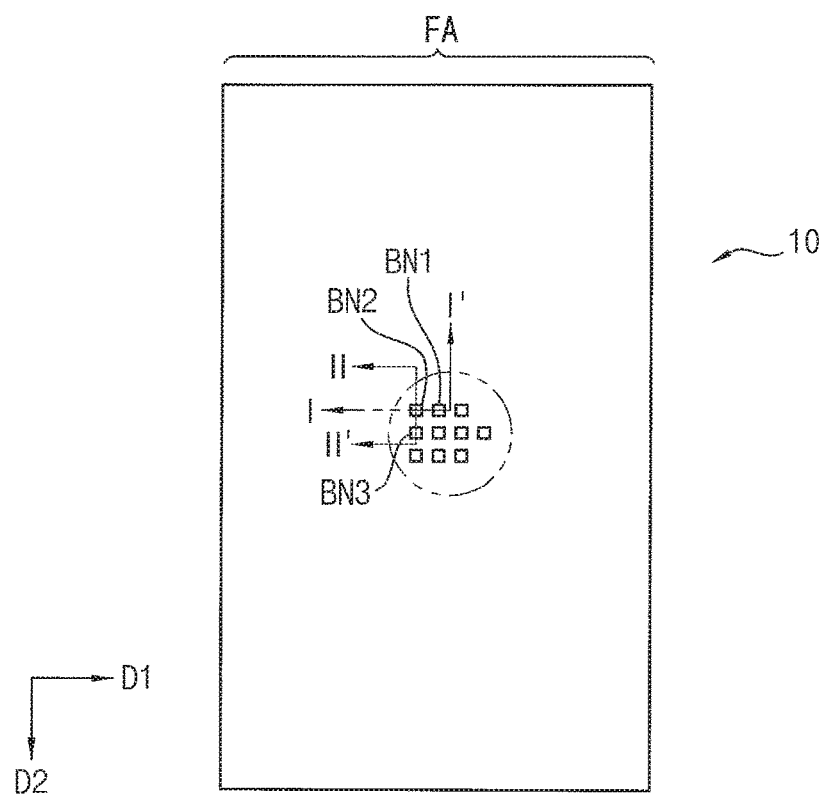
FIG. 7A is a plan view illustrating a display apparatus according to an exemplary embodiment of the inventive concept.
Figure 7B:
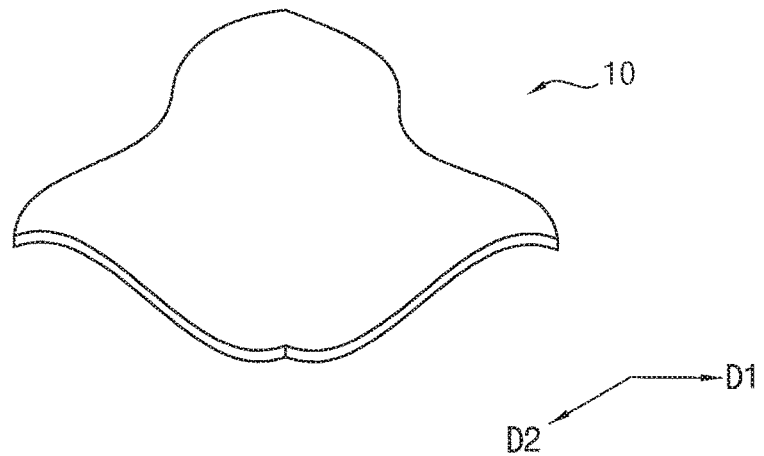
FIG. 7B is a perspective view illustrating the display apparatus of FIG. 7A being freely bent.
Figure 8A:
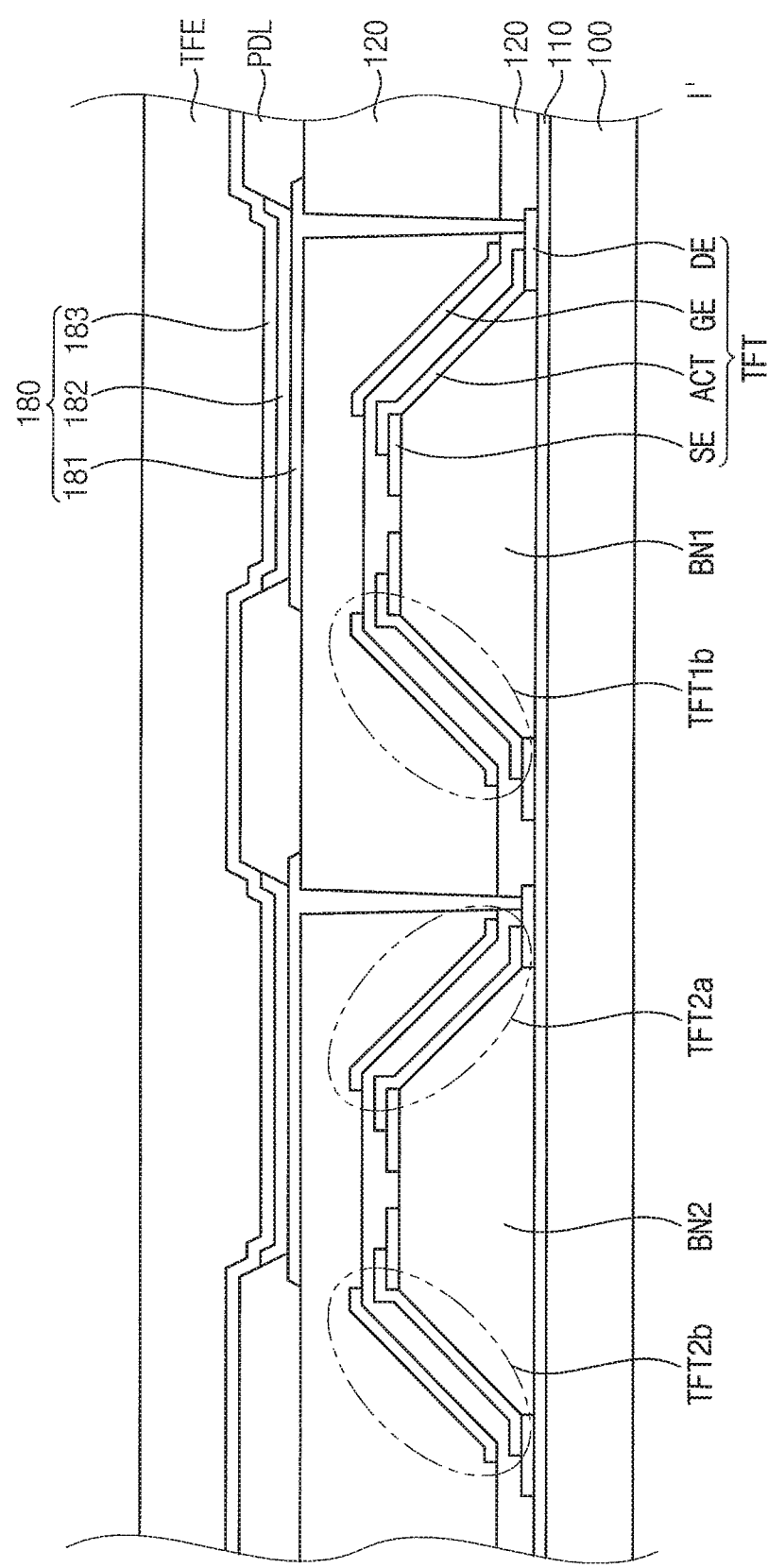
FIG. 8A is a cross-sectional view illustrating the display apparatus taken along a line I-I' in FIG. 7A.
Figure 8B:
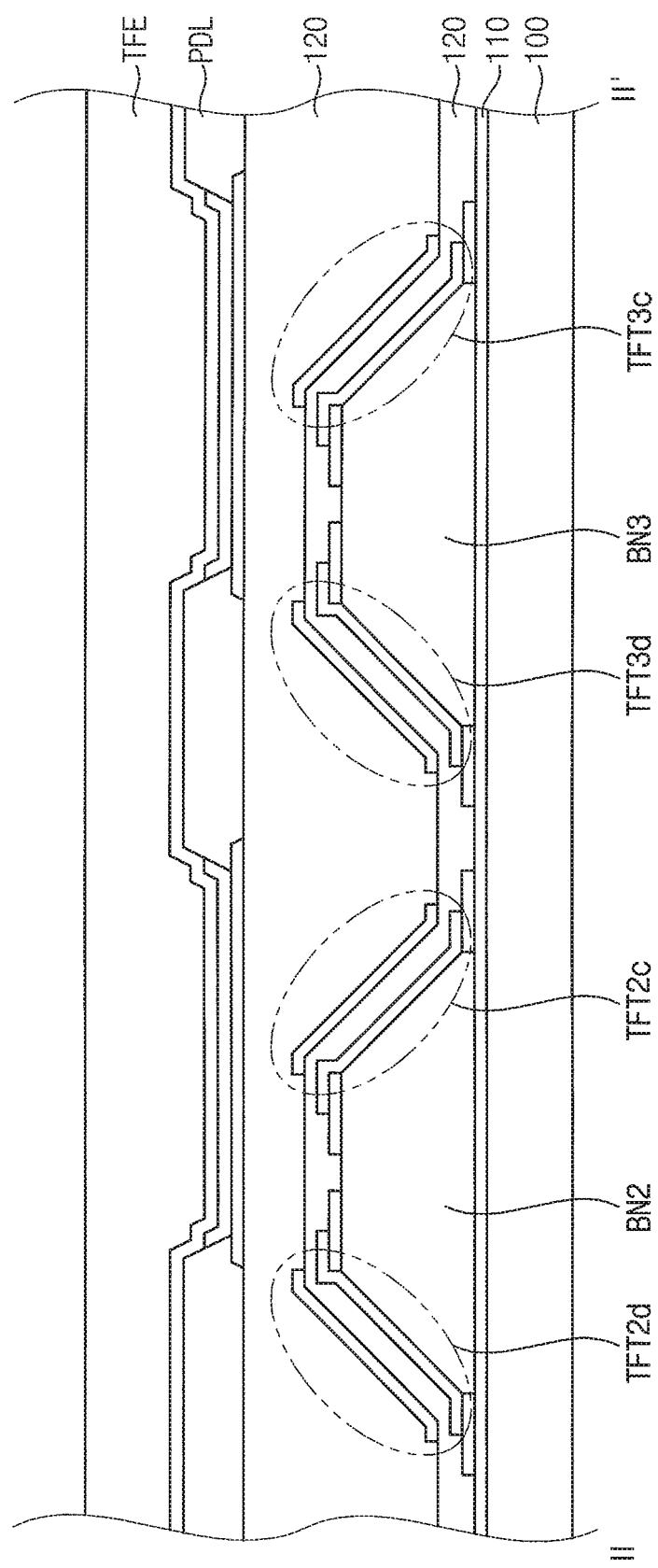
FIG. 8B is a cross-sectional view illustrating the display apparatus taken along a line II-II' in FIG. 7A.

FIG. 7A is a plan view illustrating a display apparatus according to an exemplary embodiment of the inventive concept. FIG. 7B is a perspective view illustrating the display apparatus of FIG. 7A being freely bent. FIG. 8A is a cross-sectional view illustrating the display apparatus taken along a line I-I' in FIG. 7A. FIG. 8B is a cross-sectional view illustrating the display apparatus taken along a line II-II' in FIG. 7A.

Referring to FIGS. 7A to 8B, the display apparatus 10 is substantially the same as the display apparatus 10 of FIGS. 4A to 6, except that the flexible area FA is formed on the entire display apparatus 10 without having a reinforcing area so that shape and arrangement of banks BN are different. Therefore, the duplicate description will be omitted.

The entire of the display apparatus 10 may be the flexible area FA, so that display apparatus 10 can be bent in any direction in the plane defined by the first direction D1 and along the second direction D2. The display apparatus 10 may include a plurality of banks BN arranged in a matrix form along the first direction D1 and the second direction D2. That is, each of the banks BN has an island shape and may be arranged along the first direction D1 and the second direction D2. For example, the display apparatus 10 may include a first bank BN1, a second bank BN2 that is spaced apart from the first bank BN1 in the first direction D1, and a third bank BN3 that is spaced apart from the second bank BN2 in the second direction D2.

Thus, each of the banks BN can have four inclined surfaces IS. Active patterns ACT of the thin film transistors TFT can be formed on each of the inclined surfaces IS. Referring to FIG. 8A, thin film transistors TFT1a and TFT1b may be disposed on both inclined surfaces IS of the first bank BN1 in the first direction D1, and thin film transistors TFT2*a* and TFT2*b* may be disposed on both inclined surfaces IS of the second banks BN2 in the first direction D1.

Referring to FIG. 8B, thin film transistors TFT2*c* and TFT2*d* are disposed on both inclined surfaces IS of the second bank BN2 in the second direction D2, and thin film transistors TFT3*c* and TFT3*d* may be disposed on both inclined surfaces IS of the third bank BN3 in the second direction D2.

That is, a plurality of thin film transistors TFT can be arranged on the inclined surfaces IS of one bank BN, so that a space in a plan view occupied by the plurality of thin film transistors TFT included in one pixel can be reduced. Accordingly, the size of the pixel can be reduced, high resolution can be realized, and the display quality can be improved.

Figure 9:
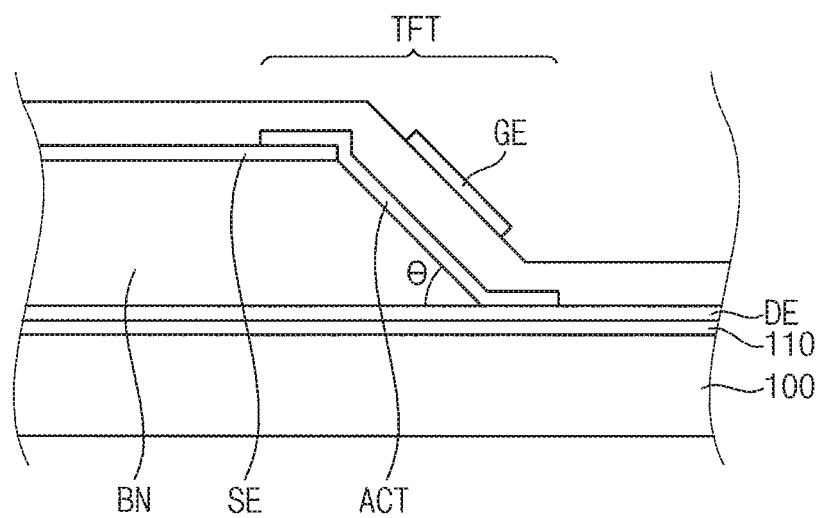
FIG. 9 is a cross-sectional view illustrating a thin film transistor substrate according to an exemplary embodiment of the inventive concept.

FIG. 9 is a cross-sectional view illustrating a thin film transistor substrate according to an exemplary embodiment of the inventive concept.

Referring to FIG. 9, the thin film transistor substrate is substantially the same as the thin film transistor substrate of FIGS. 1 to 3 except for a shape of the drain electrode DE. Therefore, repeated explanation will be omitted.

The thin film transistor substrate may include a substrate 100, a buffer layer 110 a first conductive layer including a drain electrode DE, a bank BN, a second conductive layer including a source electrode SE, an active pattern ACT, a gate insulating layer 120, a third conductive layer including a gate electrode GE.

The drain electrode DE may be formed between the bank BN and the buffer layer 110. A portion of the drain electrode DE may extend to overlap with at least a portion of the source electrode SE in a plan view.

Figure 10:
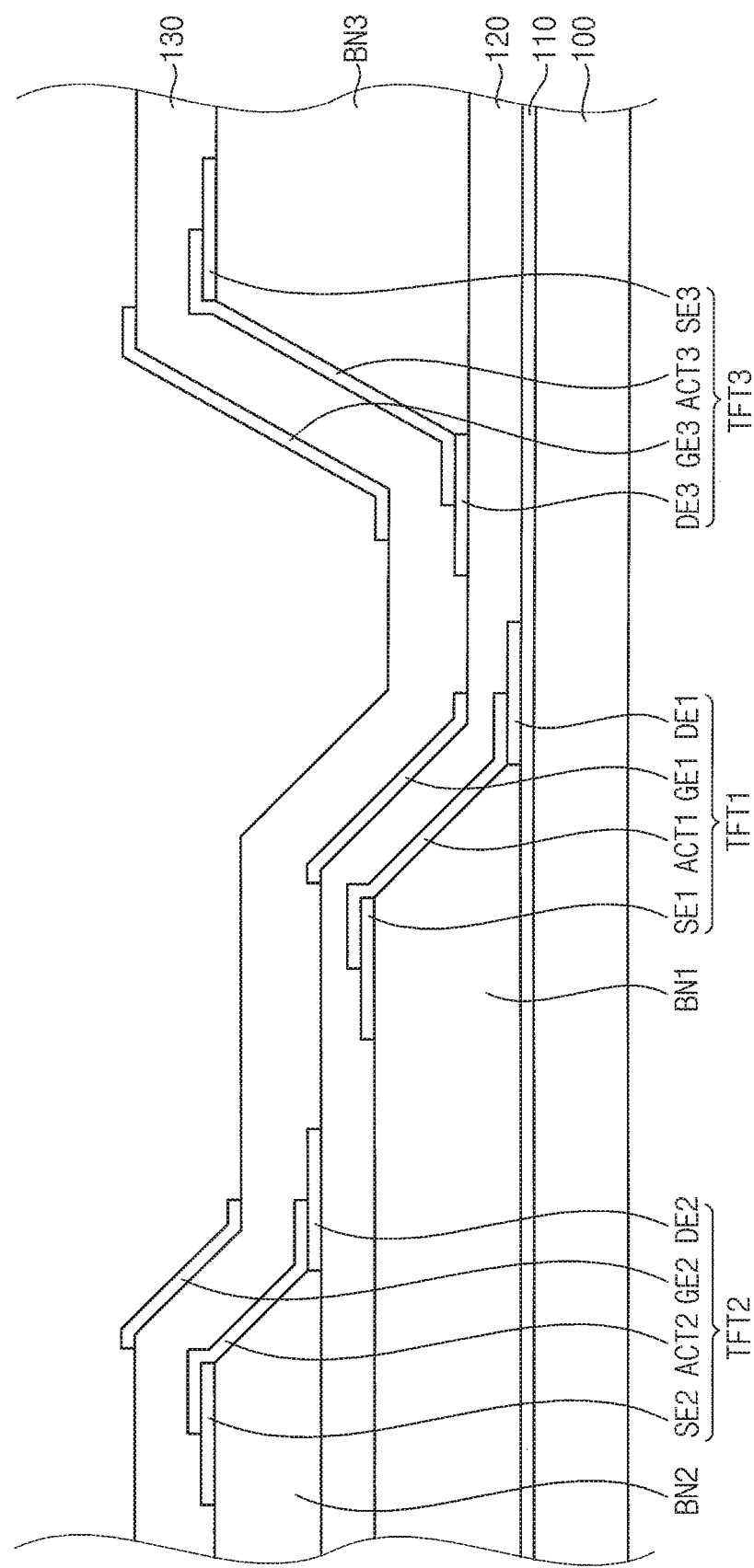
FIG. 10 is a plan view illustrating a thin film transistor substrate according to an exemplary embodiment of the inventive concept.

FIG. 10 is a plan view illustrating a thin film transistor substrate according to an exemplary embodiment of the inventive concept.

Referring to FIG. 10, the thin film transistor substrate is the same as the thin film transistor substrate of FIGS. 1 to 3 except for a second thin film transistor, a third thin film transistor, and second and third banks BN2 and BN3 in which the second thin film transistor and the third thin film transistor are disposed. Therefore, repeated explanation is omitted.

The thin film transistor substrate may include a substrate 100, a buffer layer 110, a first conductive layer, a first bank BN1, a second conductive layer, a first active pattern ACT 1, a gate insulating layer 120, a third conductive layer, a second bank BN2, a third bank BN3, a fourth conductive layer, a via insulating layer 130, and a fifth conductive layer.

The first conductive layer may include a first drain electrode DEL The second conductive layer may include a first source electrode SE1. The third conductive layer may include a first gate electrode GE1, a second drain electrode DE2, and a third drain electrode DE3. The fourth conductive layer may include a second source electrode SE2 and a third source electrode SE3. The fifth conductive layer may include a second gate electrode GE2 and a third gate electrode GE3.

A first thin film transistor TFT1 may include the first drain electrode DE1, the first source electrode SE1, a first active pattern ACT1, and the first gate electrode GE1. The first active pattern ACT1 of the first thin film transistor TFT1 may be disposed on an inclined surface IS of the first bank BN1.

A second thin film transistor TFT2 may include the second drain electrode DE2, the second source electrode SE2, a second active pattern ACT2, and the second gate electrode GE2. The second bank BN2 is disposed to overlap the first bank BN1 in a plan view. The second active pattern ACT2 of the second thin film transistor TFT2 may be disposed on an inclined surface IS of the second bank BN2.

A third thin film transistor TFT3 may include the third drain electrode DE3, the third source electrode SE3, a third active pattern ACT3, and the third gate electrode GE3. The third bank BN3 is disposed on the gate insulating layer 120 without overlapping the first bank BN1 or the second bank BN2 in a plan view. The third active pattern ACT3 of the third thin film transistor TFT3 may be disposed on an inclined surface IS of the third bank BN3.

According to the present embodiment, the thin film transistors TFT of the display apparatus 10 may include a plurality of active patterns ACT formed on the inclined surface IS of the banks BN. It is understood that the configuration of the thin film transistors TFT and the banks BN may be modified from the exemplary embodiment illustrated in FIG. 10 to have various structures and configuration without deviating from the scope of the present disclosure.

FIGS. 11A to 11E are cross-sectional views illustrating a method of manufacturing a thin film transistor substrate according to an exemplary embodiment of the inventive concept.

Figure 11A:
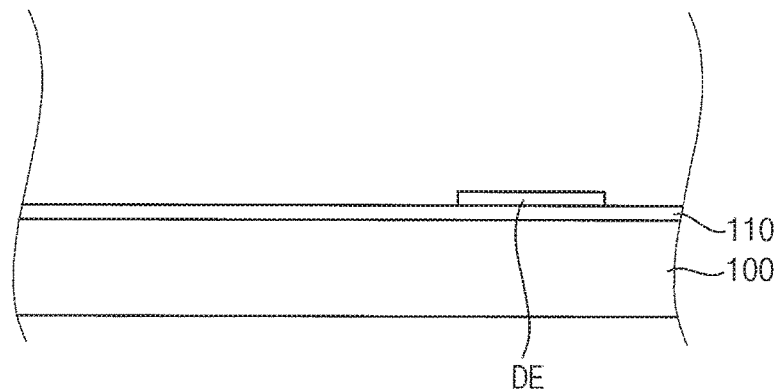
FIGS. 11A to 11E are cross-sectional views illustrating a method of manufacturing a thin film transistor substrate according to an exemplary embodiment of the inventive concept.

Referring to FIG. 11A, a buffer layer 110 may be formed on a substrate 100. A first conductive layer including a drain electrode DE may be formed on the buffer layer 110.

Figure 11B:
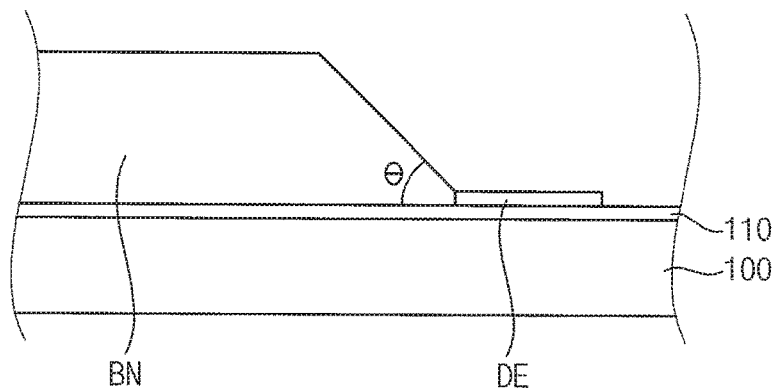

Referring to FIG. 11B, a bank BN may be formed on the buffer layer 110. The bank BN may have an inclined surface IS having an angle θ with respect to the substrate 100. According to another embodiment, the bank BN may be formed on the buffer layer 110 prior to forming the drain electrode DE on the buffer layer 110.

Figure 11C:
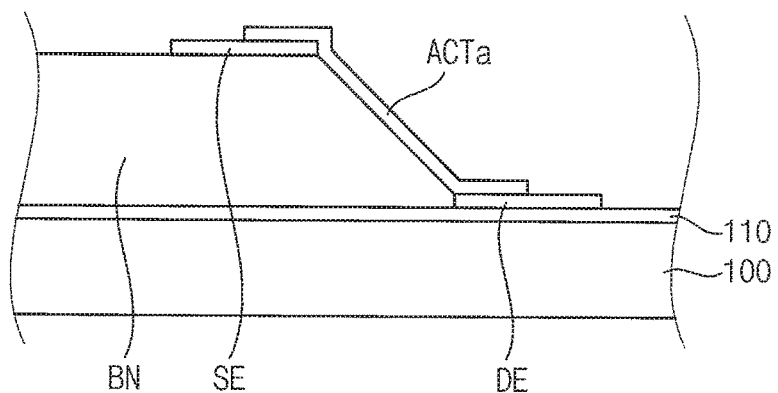

Referring to FIG. 11C, a second conductive layer including a source electrode SE may be formed on the bank BN, for example, on a flat surface of the bank BN that is adjacent to an end of the inclined surface IS. A preliminary active pattern ACTa contacting and covering the drain electrode DE and the source electrode SE may be formed on the inclined surface IS of the bank BN. The preliminary active pattern ACTa may include amorphous silicon.

Figure 11D:
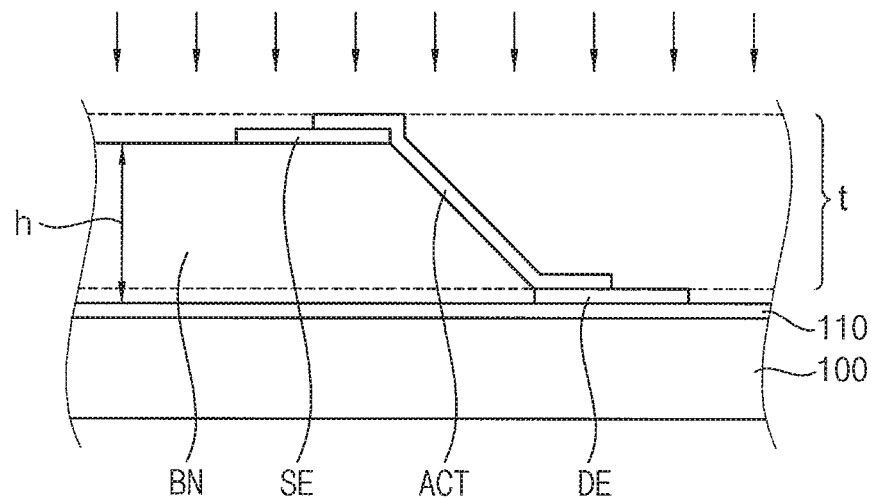

Referring to FIG. 11D, the preliminary active pattern ACTa can be crystallized by irradiating an excimer laser using a laser apparatus (not shown) to form an active pattern ACT containing crystallized polysilicon. For example, the irradiation of the excimer laser may be performed by a linear beam scanning method.

In the case of a general laser apparatus, a focal length of the excimer laser may be set to be about 150 um in a vertical direction. Thus, it may be necessary to adjust a height of the active pattern ACT by adjusting a height of the bank BN regarding the focal length.

For example, the vertical height t of the preliminary active pattern ACTa to the substrate 100 may be adjusted so that the entire area of the preliminary active pattern ACTa is located within the focal length of the excimer laser. The vertical height t may be within about 200 um (micrometer). For example, a height h of the bank BN may be about 150 um in consideration of the inclined surface IS of the bank BN and the focal distance of the excimer laser.

Figure 11E:
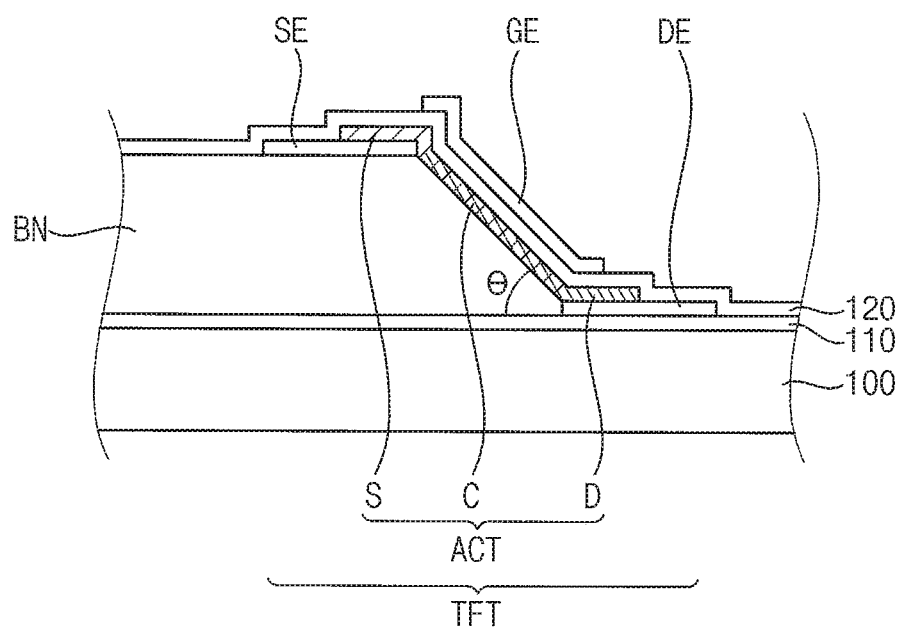

Referring to FIG. 11E, a gate insulating layer 120 may be formed on the active pattern ACT. A second conductive layer including a gate electrode GE may be formed on the gate insulating layer 120. Thereafter, a source region S, a drain region D, and a channel region C of the active pattern ACT can be formed by doping an impurity in portions of the active pattern ACT.

Figure 12:
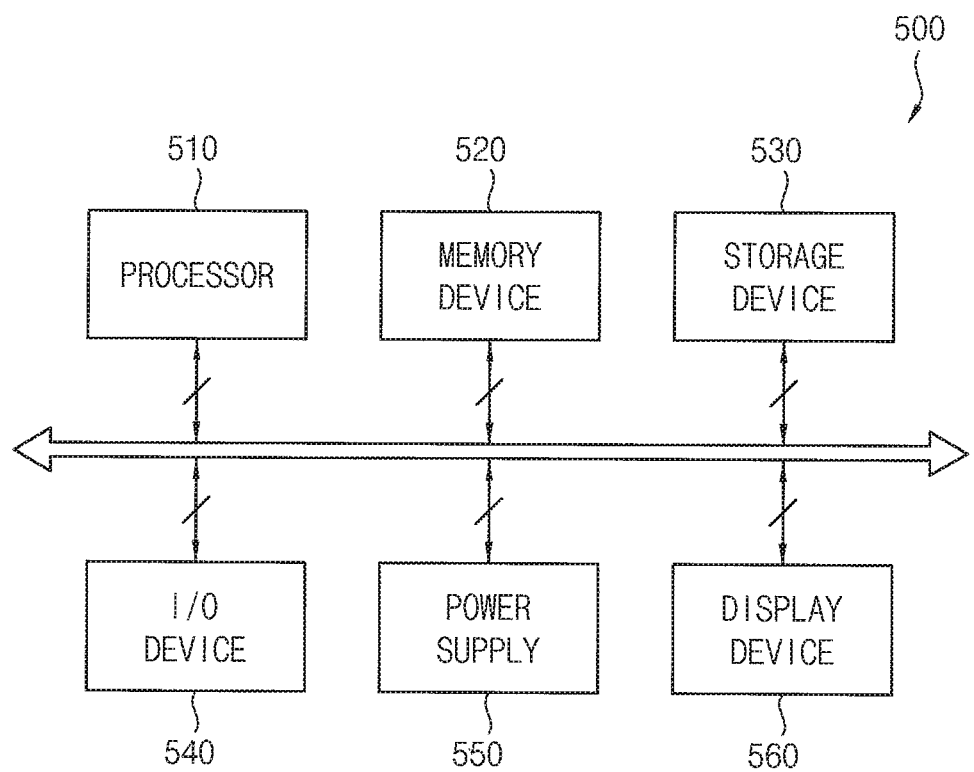
FIG. 12 is a block diagram illustrating an electronic device according to example embodiments.

FIG. 12 is a block diagram illustrating an electronic device according to example embodiments.

Referring to FIG. 12, an electronic device 500 may include a processor 510, a memory device 520, a storage device 530, an input/output (I/O) device 540, a power supply 550, and a display device 560. Here, the display device 560 may correspond to the display apparatus 10 of FIG. 4A to 5B. In addition, the electronic device 500 may further include a plurality of ports for communicating with various peripheral devices including, but not limited to, a video card, a sound card, a memory card, a universal serial bus (USB) device, and other electronic devices. In an example embodiment, the electronic device 500 may be implemented as a television. In another example embodiment, the electronic device 500 may be implemented as a smart phone. It is understood that the electronic device 500 is not limited thereto. For example, the electronic device 500 may be implemented as a cellular phone, a video phone, a smart pad, a smart watch, a tablet PC, a car navigation system, a computer monitor, a laptop, a head mounted display (HMD), etc.

The processor 510 may execute various computing instructions. The processor 510 may be a micro processor, a central processing unit (CPU), an application processor (AP), etc. The processor 510 may be coupled to other components via various communication buses including, but not limited to, an address bus, a control bus, and a data bus. Further, the processor 510 may be coupled to an extended bus such as a peripheral component interconnection (PCI) bus. The memory device 520 may store data for operating the electronic device 500. For example, the memory device 520 may include at least one non-volatile memory device such as an erasable programmable read-only memory (EPROM) device, an electrically erasable programmable read-only memory (EEPROM) device, a flash memory device, a phase change random access memory (PRAM) device, a resistance random access memory (RRAM) device, a nano floating gate memory (NFGM) device, a polymer random access memory (PoRAM) device, a magnetic random access memory (MRAM) device, a ferroelectric random access memory (FRAM) device, etc, and/or at least one volatile memory device such as a dynamic random access memory (DRAM) device, a static random access memory (SRAM) device, a mobile DRAM device, etc. The storage device 530 may include a solid state drive (SSD) device, a hard disk drive (HDD) device, a CD-ROM device, etc. The I/O device 540 may include an input device such as a keyboard, a keypad, a mouse device, a touchpad, a touch-screen, etc. and an output device such as a printer, a speaker, etc. The power supply 550 may provide power for operating the electronic device 500.

The display device 560 may be coupled to other components of the electronic device 500 via the buses or other communication links. In some example embodiments, the display device 560 may be included in the I/O device 540. As described above, according to the display apparatus 10 disclosed herein, an active pattern of a thin film transistor is disposed on an inclined surface of a bank so that a space in a plan view occupied by the thin film transistor can be reduced. Accordingly, the size of a pixel of the display device 560 can be reduced, the display device can have high resolution, and the display quality of the display device can be improved. In addition, a height of the bank can be set in consideration of a focal distance of an excimer laser for crystallizing the active pattern. In addition, the active pattern may be disposed so that a channel region of the thin film transistor is formed on the inclined surface of the bank, thereby preventing deterioration of the quality of the thin film transistor that may be caused by a poor crystallization quality. In addition, the display device 560 may embody a flexible display device including a flexible area in which the banks of appropriate shapes, sizes, and configurations are arranged so that the display device 560 may be foldable, bendable, or rollable.

The present disclosure can be applied to an organic light emitting display device and various electronic devices including the same. For example, the present disclosure can be applied to a mobile phone, a smart phone, a video phone, a smart pad, a smart watch, a tablet PC, a car navigation system, a television, a computer monitor, a notebook, or the like.

The foregoing is illustrative of the inventive concept and is not to be construed as limiting thereof. Although some exemplary embodiments of the inventive concept have been described, those skilled in the art will readily appreciate that many modifications and deviations are possible in the exemplary embodiments without materially departing from the novel teachings and advantages of the inventive concept. Accordingly, such modifications and deviations are intended to be included within the scope of the inventive concept. In the claims, means-plus-function clauses are intended to cover the structures described herein as performing the recited function and not only structural equivalents but also equivalent structures. Therefore, it is to be understood that the foregoing is illustrative of the inventive concept and is not to be construed as limited to the specific exemplary embodiments disclosed, and that modifications and deviations to the disclosed exemplary embodiments, as well as other exemplary embodiments, are intended to be included within the scope of the inventive concept. The inventive concept is defined by the following claims, with equivalents of the claims to be included therein.

What is claimed is:

1. A thin film transistor substrate, comprising:
   a substrate;
   a first electrode disposed on the substrate;
   a bank disposed on the substrate and having an inclined surface inclined at an angle with respect to the substrate;
   a second electrode disposed on the bank;
   an active pattern electrically connected to the first electrode and the second electrode, disposed on the inclined surface, and including a first conductive region and a second conductive region in which impurities are doped, and a channel region between the first conductive region and the second conductive region; and
   a gate electrode extending in a first direction in a plan view and overlapping at least a portion the channel region of the active pattern,
   wherein the inclined surface extends in a second direction that crosses the first direction in the plan view, and
   wherein the first conductive region, the channel region, and the second conductive region are disposed on the inclined surface in an order of the first conductive region, the channel region, and the second conductive region along the second direction in the plan view.

2. The thin film transistor substrate of claim 1, wherein the first electrode and the second electrode are disposed on opposite sides of the channel region in the first direction and the second direction in the plan view.

3. The thin film transistor substrate of claim 1, wherein a height difference between the first electrode and the second electrode is no more than 200 um (micrometer).

4. The thin film transistor substrate of claim 1, wherein the first conductive region has a first portion overlapping the first electrode and a second portion connected to the first portion and overlapping a portion of the inclined surface that is adjacent to the first electrode.

5. The thin film transistor substrate of claim 1, wherein the active pattern has an S-shape or extends in a zigzag pattern on the inclined surface.

6. A display apparatus, comprising:
a substrate;
a first bank disposed on the substrate and having a first inclined surface inclined at a first angle with respect to the substrate;
a first thin film transistor including a first electrode, a second electrode, a first active pattern, and a gate electrode that extends in a first direction in a plan view; and
a light emitting structure electrically connected to the first thin film transistor,
wherein the first electrode is disposed on the substrate, and the second electrode is disposed on the first bank,
wherein the first active pattern is electrically connected to the first electrode and the second electrode and disposed on the first inclined surface,
wherein the first active pattern includes a first conductive region and a second conductive region in which impurities are doped, and a channel region between the first conductive region and the second conductive region, and the gate electrode overlaps the channel region of the first active pattern,
wherein the first inclined surface extends in a second direction that crosses the first direction in the plan view, and
wherein the first conductive region, the channel region, and the second conductive region are disposed on the first inclined surface in an order of the first conductive region, the channel region, and the second conductive region along the second direction in the plan view.

7. The display apparatus of claim 6,
wherein the substrate includes a first reinforcing area and a second reinforcing area and a flexible area that is bendable and disposed between the first reinforcing area and the second reinforcing area.

8. The display apparatus of claim 6, wherein a height difference between the first electrode and the second electrode is no more than 200 um (micrometer).

9. The display apparatus of claim 6, wherein the first conductive region has a first portion overlapping the first electrode and a second portion connected to the first portion and overlapping a portion of the first inclined surface that is adjacent to the first electrode.

10. The display apparatus of claim 6, further comprising:
a second bank spaced apart from the first bank in the first direction; and
a second thin film transistor including a second active pattern,
wherein the second bank includes a second inclined surface that is inclined at a second angle with respect to the substrate, and
wherein the active pattern of the second thin film transistor is disposed on the second inclined surface of the second bank.

11. The display apparatus of claim 10, further comprising:
a third bank spaced apart from the first bank in the second direction,
wherein each of the first bank, the second bank, and the third bank has an island shape, and
wherein the substrate is bendable along the first direction and the second direction.

12. The display apparatus of claim 6, further comprising:
a second thin film transistor having a second active pattern,
wherein the first bank further includes a second inclined surface inclined at a second angle with respect to the substrate and opposite to the first inclined surface, and
wherein the second active pattern of the second thin film transistor is disposed on the second inclined surface of the first bank.

13. The display apparatus of claim 6, wherein a modulus of elasticity of the first bank is 10 GPa or more.

14. The display apparatus of claim 6, wherein the channel region of the first active pattern is formed on the first inclined surface.

* * * * *